United States Patent
Joo et al.

(10) Patent No.: US 9,631,085 B2
(45) Date of Patent: Apr. 25, 2017

(54) POLYMER BLEND, ORGANIC LIGHT-EMITTING DIODE INCLUDING POLYMER BLEND, AND METHOD OF CONTROLLING CHARGE MOBILITY OF EMISSION LAYER INCLUDING POLYMER BLEND

(71) Applicants: Won-jae Joo, Yongin-si (KR); Youn-jung Park, Yongin-si (KR); Yong-sik Jung, Yongin-si (KR)

(72) Inventors: Won-jae Joo, Yongin-si (KR); Youn-jung Park, Yongin-si (KR); Yong-sik Jung, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 899 days.

(21) Appl. No.: 13/632,772

(22) Filed: Oct. 1, 2012

(65) Prior Publication Data
US 2013/0026457 A1    Jan. 31, 2013

(30) Foreign Application Priority Data

Apr. 4, 2010 (KR) .......................... 10-2012-0035109

(51) Int. Cl.
| | | |
|---|---|---|
| H01L 51/54 | (2006.01) | |
| C09K 11/06 | (2006.01) | |
| C08L 65/00 | (2006.01) | |
| H05B 33/14 | (2006.01) | |
| H01L 51/50 | (2006.01) | |
| H01L 51/00 | (2006.01) | |

(52) U.S. Cl.
CPC .............. *C08L 65/00* (2013.01); *C09K 11/06* (2013.01); *H01L 51/0043* (2013.01); *H05B 33/14* (2013.01); *C08G 2261/3142* (2013.01); *C08G 2261/3245* (2013.01); *C08G 2261/5222* (2013.01); *C08G 2261/95* (2013.01); *C08L 2205/02* (2013.01); *C09K 2211/1416* (2013.01); *C09K 2211/1475* (2013.01); *H01L 51/0037* (2013.01); *H01L 51/0039* (2013.01); *H01L 51/5012* (2013.01); *H01L 2251/308* (2013.01)

(58) Field of Classification Search
None
See application file for complete search history.

(56) References Cited

U.S. PATENT DOCUMENTS

| | | | | |
|---|---|---|---|---|
| 2005/0147842 | A1* | 7/2005 | Hirayama | ............... H01L 51/50 428/690 |
| 2007/0152573 | A1* | 7/2007 | Kim | ...................... C09K 11/06 313/506 |
| 2007/0273273 | A1* | 11/2007 | Kim | ...................... C08G 61/02 313/504 |
| 2007/0278455 | A1* | 12/2007 | Park | ..................... C08G 61/122 252/500 |
| 2008/0176104 | A1* | 7/2008 | Towns | ................ H01L 51/0035 428/704 |
| 2009/0066224 | A1 | 3/2009 | Yu et al. | |
| 2010/0051869 | A1 | 3/2010 | Chichak et al. | |

FOREIGN PATENT DOCUMENTS

| | | | |
|---|---|---|---|
| KR | 1020070089928 A | 9/2007 | |
| KR | 1020080020676 A | 3/2008 | |
| WO | WO 9954943 A1 * | 10/1999 | ......... H01L 51/5012 |

\* cited by examiner

*Primary Examiner* — Andrew K Bohaty
(74) *Attorney, Agent, or Firm* — Cantor Colburn LLP

(57) ABSTRACT

A polymer blend including a first polymer having a unit represented by Formula 1 and a second polymer having a unit represented by Formula 2:

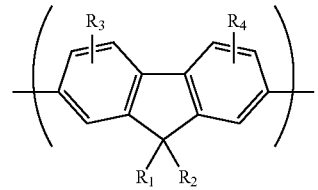

Formula 1

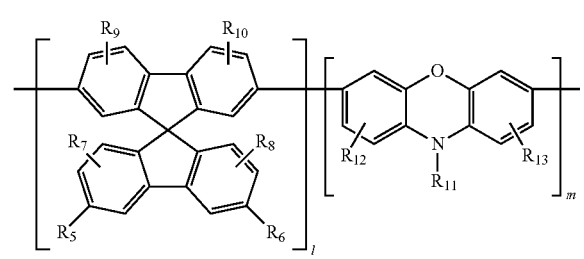

Formula 2 wherein in Formulae 1 and 2, $R_1$ through $R_{13}$, l, and m are the same as defined in the detailed description.

20 Claims, 10 Drawing Sheets

POLYMER BLEND, ORGANIC LIGHT-EMITTING DIODE INCLUDING POLYMER BLEND, AND METHOD OF CONTROLLING CHARGE MOBILITY OF EMISSION LAYER INCLUDING POLYMER BLEND

CROSS-REFERENCE TO RELATED APPLICATIONS

This application claims priority to Korean Patent Application No. 10-2012-0035109, filed on Apr. 4, 2012, and all the benefits accruing therefrom under 35 U.S.C. §119, the contents of which in their entirety are herein incorporated by reference.

BACKGROUND

1. Field

The present disclosure relates to polymer blends and organic light-emitting diodes including the polymer blends.

2. Description of the Related Art

Organic light-emitting diodes ("OLEDs") can be classified into small molecule OLEDs and polymer OLEDs according to the types of organic materials. In small molecule OLEDs, a thin film is prepared by vacuum deposition of a low molecular weight organic material. Small molecule OLEDs consist of materials that have well-known properties and relatively long lifetimes. However, since manufacturing costs of small molecule OLEDs are high, it is expensive to manufacture them on a large scale. On the other hand, in polymer OLEDs, a thin film is prepared from a high molecular weight organic material, i.e., a polymer, by using a solution coating process such as spin coating or inkjet printing. Polymer OLEDs have relatively short lifetimes, and high mechanical strength. They are manufactured by simplified processes, and may be conveniently prepared on a large scale. While technological advances in the development and use of small molecule OLEDs has been rapid, it has been much slower for polymer OLEDs.

There are several types of polymer emission layers. One type is a polymer emission layer that consists of a copolymer of hole transporting monomers, electron transporting monomers, and light-emitting monomers. Such a copolymer emission layer has bipolar properties (i.e., capable of transporting both holes and electrons) and emits lights from excitons generated by a current. The advantage of this type of the polymer emission layer is that since a single polymer has all the functions of the emission layer, a uniform film may be easily formed. However, in order to change electrical and optical properties of the polymer emission layer, a new polymer possessing desired characteristics needs to be designed and synthesized. Another type of a polymer emission layer is produced by blending small molecules and polymers, for example, by mixing light-emitting small molecules with a polymer possessing bipolar properties. However, with the increase in the ratio of small molecules to a polymer, phase separation may occur, thus making the use of such polymer emission layer difficult.

SUMMARY

An embodiment provides polymer blends capable of controlling hole and electron mobility.

Another embodiment provides organic light-emitting diodes including emission layers capable of controlling hole and electron mobility.

Another embodiment provides methods of controlling hole and electron mobility of emission layers of organic light-emitting diodes.

Additional aspects will be set forth in part in the description which follows and, in part, will be apparent from the description, or may be learned by practice of the presented embodiments.

Another embodiment provides a polymer blend including a first polymer having a unit represented by Formula 1 below and a second polymer having a unit represented by Formula 2 below:

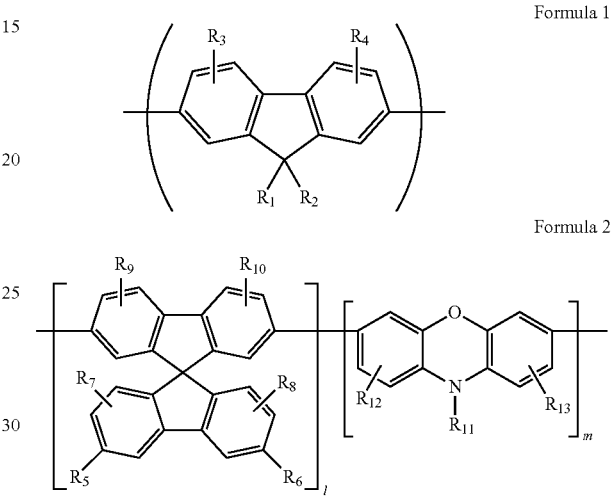

wherein $R_1$ through $R_{13}$ are each independently hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_1$-$C_{30}$ cycloalkyl group, a substituted or unsubstituted $C_1$-$C_{30}$ cycloalkenyl group, a substituted or unsubstituted $C_1$-$C_{30}$ alkoxy group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_2$-$C_{30}$ heteroaryl group, $-N(Q_1)(Q_2)$, or $-Si(Q_3)(Q_4)(Q_5)$;

$Q_1$ through $Q_5$ are each independently hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_3$-$C_{30}$ cycloalkyl group, a $C_5$-$C_{30}$ aryl group, or a $C_2$-$C_{30}$ heteroaryl group; and in Formula 2, l is an integer of 1 to 10 and m is an integer of 1 to 3, wherein l and m represent the mole ratio of each of the subunits of Formula 2.

The first polymer may have a relative electron transporting ability, and the second polymer may have a relative hole transporting ability.

The polymer blend may exhibit blue light emission, and charge mobility of an emission layer may be controlled by adjusting a composition ratio of the first polymer and the second polymer.

Another embodiment of the invention provides an organic light-emitting diode including a first electrode; a second electrode facing the first electrode; and an organic layer disposed between the first electrode and the second electrode, wherein the organic layer includes an emission layer formed from the polymer blend described above.

Yet another embodiment of the invention provides a method for controlling charge mobility of an emission layer of an organic light-emitting diode by using the polymer blend described above. The charge mobility of the emission layer is controlled by adjusting a composition ratio of the first polymer to the second polymer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
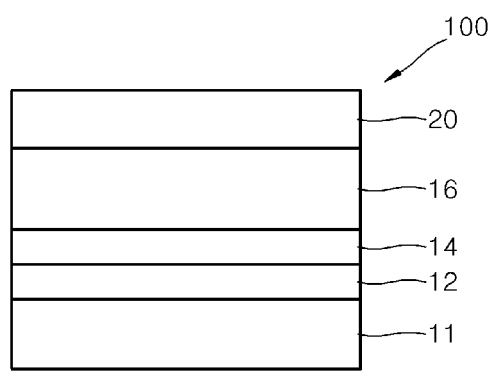
FIG. 1 is a schematic diagram illustrating a structure of an organic light-emitting diode ("OLED") according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. These embodiments are provided so that this disclosure will be thorough and complete, and will fully convey the scope of the claims to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, the term "substituted" means a hydrogen atom (e.g., 1, 2, 3, or 4 hydrogen atoms) substituted with a group selected from a halogen (F, Br, Cl, or I), a hydroxyl group (—OH), an alkoxy group (—OR wherein R is a $C_1$-$C_{20}$ alkyl group, a $C_2$-$C_{20}$ alkenyl group, or a $C_2$-$C_{20}$ alkynyl group), a cyano group (—CN), a nitro group (—$NO_2$), an amino group (—$NH_2$), an amidino group (—C(=NH)NHR wherein R is a hydrogen, $C_1$-$C_{20}$ alkyl group, a $C_2$-$C_{20}$ alkenyl group, or a $C_2$-$C_{20}$ alkynyl group), an ester group (—$CO_2$R wherein R is a $C_1$-$C_{20}$ alkyl group, a $C_2$-$C_{20}$ alkenyl group, or a $C_2$-$C_{20}$ alkynyl group), a hydrazine group (—NH—NHR wherein R is a hydrogen, $C_1$-$C_{20}$ alkyl group, a $C_2$-$C_{20}$ alkenyl group, or a $C_2$-$C_{20}$ alkynyl group), a hydrazone group (—C=N—NHR wherein R is a hydrogen, $C_1$-$C_{20}$ alkyl group, a $C_2$-$C_{20}$ alkenyl group, or a $C_2$-$C_{20}$ alkynyl group), a carboxyl group (—$CO_2$H), a sulfonic acid group (—$SO_3$H), a phosphoric acid group (—$PO_3$H), a $C_1$-$C_{20}$ alkyl group, a $C_2$-$C_{20}$ alkenyl group, a $C_2$-$C_{20}$ alkynyl group, and a combination thereof, provided that the valence of the moiety being substituted is not exceeded.

"Alkyl" as used herein means a straight or branched chain saturated aliphatic hydrocarbon having the specified number of carbon atoms, specifically 1 to 12 carbon atoms, more specifically 1 to 6 carbon atoms. Alkyl groups include, for example, groups having from 1 to 50 carbon atoms ($C_1$-$C_{50}$ alkyl).

"Cycloalkyl" as used herein means a group that comprises one or more saturated and/or partially saturated rings in which all ring members are carbon, such as cyclopropyl, cyclobutyl, cyclopentyl, cyclohexyl, cycloheptyl, cyclooctyl, adamantyl and partially saturated variants of the foregoing, such as cycloalkenyl groups (e.g., cyclohexenyl) or cycloalkynyl groups. Cycloalkyl groups do not include an aromatic ring or a heterocyclic ring. When the numbers of carbon atoms is specified (e.g., $C_3$-$C_{15}$ cycloalkyl), the number means the number of ring members present in the one or more rings.

"Alkenyl" as used herein means a straight or branched chain, monovalent hydrocarbon group having at least one carbon-carbon double bond (e.g., ethenyl(—HC=$CH_2$)).

"Alkynyl" as used herein means a straight or branched chain, monovalent hydrocarbon group having at least one carbon-carbon triple bond (e.g., ethynyl).

"Cycloalkenyl" as used herein may refer to a monovalent group having one or more rings and one or more carbon-carbon double bond in the ring, wherein all ring members are carbon (e.g., cyclopentyl and cyclohexyl).

"Aryl" as used herein means a cyclic moiety in which all ring members are carbon and at least one ring is aromatic, the moiety having the specified number of carbon atoms, specifically 6 to 24 carbon atoms, more specifically 6 to 12 carbon atoms. More than one ring may be present, and any additional rings may be independently aromatic, saturated or partially unsaturated, and may be fused, pendant, spirocyclic or a combination thereof.

"Aryloxy" as used herein means an aryl moiety that is linked via an oxygen (i.e., —O-aryl).

"Arylthio" as used herein means an aryl moiety that is linked via a sulfur (i.e., —S-aryl).

"Aryl alkyl" as used herein means a substituted or unsubstituted aryl group covalently linked to an alkyl group that is linked to a compound (e.g., a benzyl is a C7 aryl alkyl group).

"Aryl alkoxy" as used herein means a substituted or unsubstituted aryl group covalently linked to an alkoxy group that is linked to a compound (e.g., a benzyloxy is a C7 aryl alkoxy group).

"Heteroaryl" as used herein means a monovalent carbocyclic ring group that includes one or more aromatic rings, in which at least one ring member (e.g., one, two or three ring members) is a heteroatom (e.g., nitrogen (N), oxygen (O), phosphorus (P), silicon (Si), and sulfur (S)). In a $C_3$-$C_{30}$ heteroaryl, the total number of ring carbon atoms ranges from 3 to 30, with remaining ring atoms being heteroatoms. Multiple rings, if present, may be pendent, spiro or fused.

"Salts" as used herein includes derivatives of the disclosed compounds in which the parent compound is modified by making inorganic and organic, base addition salts thereof, for example a Na, Ca, Mg, K, hydroxide, carbonate, bicarbonate, or the like salt.

"Blend" as used herein includes any and all combinations of polymers. In a specific embodiment a "blend" is a combination of substantially miscible or fully miscible polymers. In a specific embodiment, the polymers are fully miscible.

"In a range" as used herein includes the endpoints of the recited range.

Hereinafter, a polymer blend according to an exemplary embodiment will be described in more detail.

According to an embodiment, a polymer blend includes a first polymer having a repeating unit represented by Formula 1 below and a second polymer having a repeating unit represented by Formula 2 below:

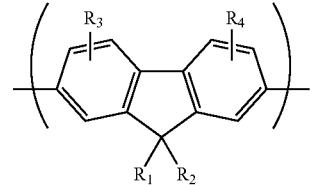

Formula 1

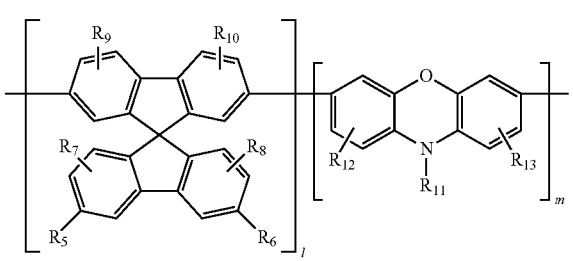

Formula 2 wherein $R_1$ through $R_{13}$ may each independently be hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_1$-$C_{30}$ cycloalkyl group, a substituted or unsubstituted $C_1$-$C_{30}$ cycloalkenyl group, a substituted or unsubstituted $C_1$-$C_{30}$ alkoxy group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, a substituted or unsubstituted $C_2$-$C_{30}$ heteroaryl group, —N($Q_1$)($Q_2$), or —Si($Q_3$)($Q_4$)($Q_5$), and the $R_3$ groups, the $R_4$ groups, the $R_7$-$R_{10}$ groups, the $R_{12}$ groups, and $R_{13}$ groups may each independently be identical to or different from each other;

$Q_1$ through $Q_5$ may each independently be hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_3$-$C_{30}$ cycloalkyl group, a $C_5$-$C_{30}$ aryl group, or a $C_2$-$C_{30}$ heteroaryl group; and in Formula 2, l is an integer of 1 to 10 and m is an integer of 1 to 3, wherein l and m represent the molar ratio of each subunit in Formula 2.

In particular, $R_1$ and $R_2$ may each independently be a $C_1$-$C_{10}$ alkyl group, a $C_6$-$C_{12}$ aryl alkyl group, or a $C_6$-$C_{12}$ aryl alkoxy group. For example, $R_1$ and $R_2$ may each independently be octyl, 4-octylbenzyl, or 4-(octyloxy)benzyl. In this regard, $R_1$ and $R_2$ may be identical to or different from each other.

In particular, $R_3$ and $R_4$ may each independently be hydrogen, deuterium, a halogen atom, a hydroxyl group, a cyano group, a nitro group, an amino group, a carboxyl group or a salt thereof, a $C_1$-$C_{10}$ alkyl group, a $C_6$-$C_{12}$ aryl alkyl group, or a $C_6$-$C_{12}$ aryl alkoxy group. For example, $R_3$ and $R_4$ may each independently be hydrogen, methyl, phenyl, or fluorine.

In particular, $R_5$ and $R_6$ may each independently be a $C_1$-$C_{10}$ alkyl group or a $C_1$-$C_{10}$ alkoxy group. For example, $R_5$ and $R_6$ may each independently be octyl or octyloxy.

In particular, $R_7$ through $R_{10}$ may each independently be hydrogen, deuterium, a halogen atom, a hydroxyl group, a cyano group, a nitro group, an amino group, an amidino group, a carboxyl group or a salt thereof, a $C_1$-$C_{10}$ alkyl group, a $C_6$-$C_{12}$ aryl alkyl group, or a $C_6$-$C_{12}$ aryl alkoxy group. For example, $R_7$ through $R_{10}$ may each independently be hydrogen, methyl, phenyl, or fluorine.

In particular, $R_{11}$ may be a $C_1$-$C_{10}$ alkyl group, a $C_6$-$C_{12}$ aryl alkyl group, or a $C_6$-$C_{12}$ aryl alkoxy group. For example, $R_{11}$ may be 2-ethylhexyl or 6-ethylhexyloxynaphth-2-yl.

In particular, $R_{12}$ and $R_{13}$ may each independently be hydrogen, deuterium, a halogen atom, a hydroxyl group, a cyano group, a nitro group, an amino group, a carboxyl group or a salt thereof, a $C_1$-$C_{10}$ alkyl group, a $C_6$-$C_{12}$ aryl alkyl group, or a $C_6$-$C_{12}$ aryl alkoxy group. For example, $R_{12}$ and $R_{13}$ may each independently be hydrogen, methyl, phenyl, or fluorine.

More particularly, for example, $R_1$ and $R_2$ may each independently be 4-octyloxybenzyl, $R_5$ and $R_6$ may each be octyloxy, $R_{11}$ may be 6-ethylhexyloxynaphth-2-yl, and $R_3$, $R_4$, $R_7$ through $R_{10}$, $R_{12}$, and $R_{13}$ may each independently be hydrogen.

In particular, l is an integer of 1 to 5 and m is an integer of 1, wherein l and m represent the molar ratio of each subunit in Formula 2. In another embodiment, l is an integer of 1 to 4 and m is an integer of 1, wherein l and m represent the molar ratio of each subunit in Formula 2.

The first polymer having a repeating unit of Formula 1 may have a molecular weight of about 1,000 Daltons ("Da") to about 2,000,000 Da, specifically about 100,000 Da to about 1,000,000 Da, and the second polymer having a repeating unit of Formula 2 may have a molecular weight of about 1,000 Da to about 2,000,000 Da, specifically about 100,000 Da to about 1,000,000 Da. In a specific embodiment the molecular weight is the weight average molecular weight.

The first polymer comprises repeating fluorene derivative units. Alternatively, the first polymer may consist essentially of repeating fluorene derivative units (i.e., no units are present that would significantly adversely affect the properties of the first polymer as described below), or the first polymer may consist of repeating fluorene derivative units (i.e., no or substantially no repeating units other than fluorene units are present in the polymer). The second polymer comprises a copolymer of repeating fluorene derivative units and repeating phenoxazine derivative units. Alternatively, the second polymer may consist essentially of repeating fluorene derivative units and repeating phenoxazine derivative units (i.e., no units are present that would significantly adversely affect the properties of the first polymer as described below), or the second polymer may consist of repeating fluorene derivative units and repeating phenoxazine derivative units (i.e., no or substantially no repeating units other than fluorene units are present in the polymer). Due to the presence of the foregoing units, the first and second polymers are conductive polymers having luminous properties. The second polymer exhibits blue light emission, and the polymer blend including the first and second polymers also exhibits blue light emission. Therefore, the polymer blend may be used in optoelectronic single devices including an organic electroluminescent device and an illumination device.

The first polymer has an excellent electron transporting ability and, therefore, is an electron transporting polymer. The second polymer has an excellent hole transporting ability and, therefore, is a hole transporting polymer. Without being bound by theory, it is believed that the excellent hole transporting ability of the second polymer is attributable to the presence of the phenoxazine derivative units, which can transport holes due to the electron donor properties of a nitrogen atom.

In an embodiment, in Formula 2 a molar ratio of l to m may be 1:3 to 10:1. However, it has been found that particularly advantageous properties, in particular current efficiency, can be obtained when in Formula 2, a ratio of l to m may be in the range of about 1:1 to about 5:1 (molar ratio). That is, the mole fraction of the fluorene derivative units in the unit of Formula 2 may be in the range of about 50 mol % to about 83 mol %, and the mole fraction of the phenoxazine derivative units in the unit of Formula 2 may be in the range of about 17 mol % to about 50 mol %. In another embodiment, the mole fraction of the fluorene derivative units in the unit of Formula 2 may be in the range of about 50 mol % to about 80 mol %, and the mole fraction of the phenoxazine derivative units in the unit of Formula 2 may be in the range of about 20 mol % to about 50 mol %. It has been found that as the amount of the phenoxazine derivative units in the second polymer decreases, for example to less than 20 mol %, less than 17 mol %, or less than 10 mol %, the hole conducting properties of the second polymer deteriorate and its electron conducting properties are improved. Such a polymer may not have p-type properties, and its light-emitting properties decrease to the extent that the current efficiency of the second polymer may be reduced, thus the polymer blend comprising the first and second polymers may overall exhibit a reduced current efficiency. On the other hand, as the amount of the phenoxazine derivative units is increased, for example to greater than 75 mol % or greater than 50 mol %, the amount of sequential (i.e., a dimer, trimer, or higher) phenoxazine derivatives increases, thus forming a large number of linkages other than the desired fluorene-phenoxazine-fluorene linkage. This increase in sequential phenoxazine derivative units results in reduced current efficiency of the second polymer and, therefore, in reduced current efficiency of the polymer blend. Thus, the polymer blend having the first and second N-aryl phenoxazine units wherein the type of units or the relative amount of each type of spirofluorene and N-aryl phenoxazine units is different.

The polymer blend may include a first polymer having a unit represented by Formula 3 below and a second polymer having a unit represented by Formula 4 below.

Formula 3

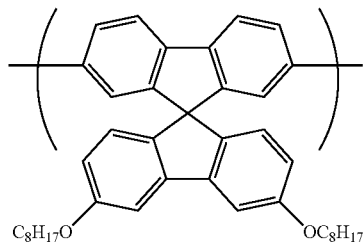

Formula 4

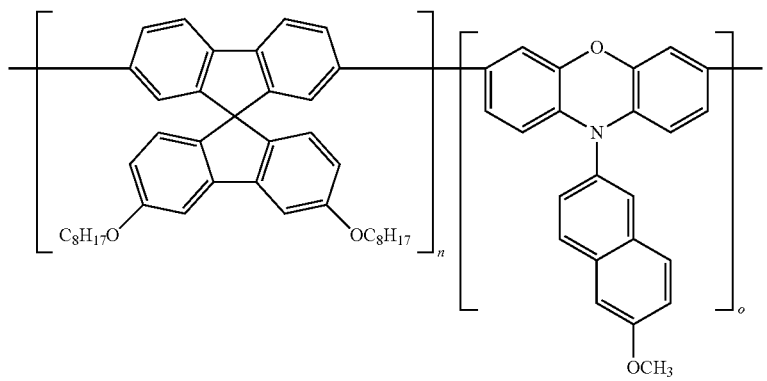

polymers wherein the composition ratios of l to m in the second polymer as described above may properly control a charge-carrier balance and may achieve a high current efficiency.

The amount of the first polymer may be in the range of about 10 wt % to about 90 wt % based on 100 wt % of the polymer blend, and the amount of the second polymer may be in the range of about 10 wt % to about 90 wt % based on 100 wt % of the polymer blend. If the amount of the first polymer increases, the polymer blend may have an increased electron transporting ability. If the amount of the second polymer increases, the polymer blend may have an increased hole transporting ability. Therefore, by adjusting a composition ratio of the first polymer and the second polymer in the blend, the charge transporting ability of the polymer blend may be controlled to a desired level.

The first polymer may be a copolymer of at least two of the units of Formula 1. For example, the first polymer may be a copolymer of a first unit represented by Formula 1 and a second unit represented by Formula 1 which is different from the first unit. In this regard, substituents of the first and second units may be different from each other. For example, the first polymer may have a copolymer of spiro-type fluorene (as illustrated by the fluorene derivative moiety of Formula 2) and butterfly-type fluorene (as illustrated by the fluorene derivative moiety of Formula 1).

The second polymer may be a blend of at least two different polymers each having the unit of Formula 2. In this regard, the units of Formula 2 may have different substituents. For example, the second polymer may consist of a blend of two or more polymers including spirofluorene and In Formula 4, n is an integer of 1 to 4 and o is an integer of 1 to 3, wherein n and o are the molar ratio of the fluorene derivative subunits and the phenoxazine subunits. In this regard, the second polymer may comprise, consist essentially of, or consist of spirofluorenyl derivative units and phenoxazine derivative units that are alternately copolymerized at a molar ratio of n:o. The first polymer having a unit of Formula 3 may have a molecular weight of about 1,000 Da to about 2,000,000 Da, specifically about 100,000 Da to about 1,000,000 Da, and the second polymer having a unit of Formula 4 may have a molecular weight of about 1,000 Da to about 2,000,000 Da, specifically about 100,000 Da to about 1,000,000 Da. In an embodiment, the molecular weight of the polymer may be a weight average molecular weight.

Hereinafter, an organic light-emitting diode according to an exemplary embodiment will be described in more detail.

FIG. 1 is a schematic cross-sectional view illustrating a structure of an OLED 100 according to an embodiment.

Hereinafter, a structure and manufacturing method of an OLED will be described in more detail with reference to FIG. 1. The OLED 100 includes a first electrode 12, a hole injection layer ("HIL") 14, an emission layer ("EML") 16, and a second electrode 20 facing the first electrode 12, all of which are sequentially stacked on a substrate 11. The OLED 100 does not include an electron transport layer, and thus, a material for forming an EML which has excellent electron mobility may be used to form a light-emitting region of the EML close to the side of the first electrode 12, whereby the OLED 100 may have an increased efficiency.

The substrate 11 may be a substrate used in a general OLED, and may be a glass substrate or a transparent plastic substrate having excellent mechanical strength, thermal stability, transparency, surface smoothness, ease of handling, and waterproofness.

A material for forming the first electrode 12 may be a metal oxide, a metal sulfide, or a metal which has a high electrical conductivity. The first electrode 12 may consist of a material having a relatively high work function. Examples of the material for forming the first electrode 12 include oxides such as indium oxide ($In_2O_3$), zinc oxide (ZnO), tin oxide ($SnO_2$), and complexes thereof (e.g., indium-tin-oxide ("ITO") and indium-zinc-oxide ("IZO")), and metals such as gold, platinum, silver, copper, and the like. Also, polyaniline or a derivative thereof, polythiophene or a derivative thereof, or the like may be used as a material for forming the first electrode 12.

The first electrode 12 may be formed as a single layer or may have a multi-layered structure having at least two layers. In addition, the first electrode 12 may include at least two different materials. The thickness of the first electrode 12 may be appropriately adjusted by considering light transmission and electrical conductivity, and may be, for example, in the range of about 10 nanometers ("nm") to about 10 micrometers ("μm"). The first electrode 12 may be formed by deposition, ion plating, plating, or sputtering.

Examples of materials for forming the HIL 14 may include, but are not limited to, phthalocyanine derivatives such as copper phthalocyanine, N,N'-diphenyl-N,N'-bis-[4-(phenyl-m-tolyl-amino)-phenyl]-biphenyl-4,4'-diamine ("DNTPD"), 4,4',4"-tris(3-methylphenylphenylamino)triphenylamine ("m-MTDATA"), 4,4'4"-tris(N,N-diphenylamino)triphenylamine ("TDATA"), 4,4',4"-tris{N,-(2-naphthyl)-N-phenyl-amino}-triphenylamine ("2T-NATA"), poly(3,4-ethylenedioxythiophene)/poly(4-styrenesulfonate) ("PEDOT:PSS"), polyaniline/dodecylbenzenesulfonic acid ("PANI/DBSA"), polyaniline/camphor sulfonic acid ("PANI/CSA"), and (polyaniline)/poly(4-styrenesulfonate) ("PANI/PSS").

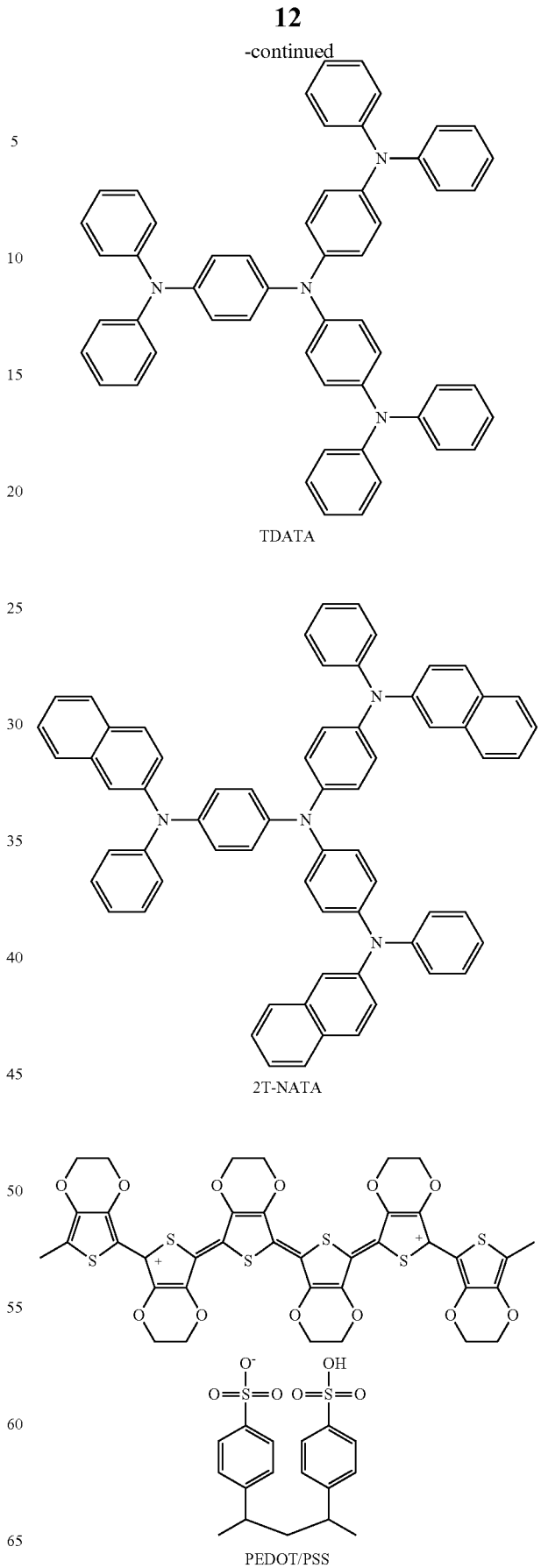

TDATA

2T-NATA

PEDOT/PSS

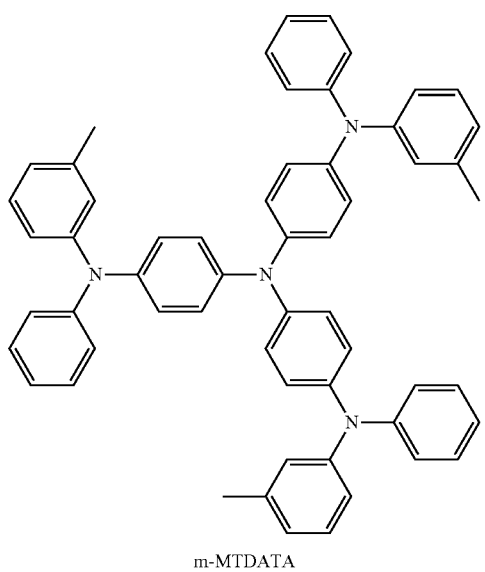

m-MTDATA

-continued

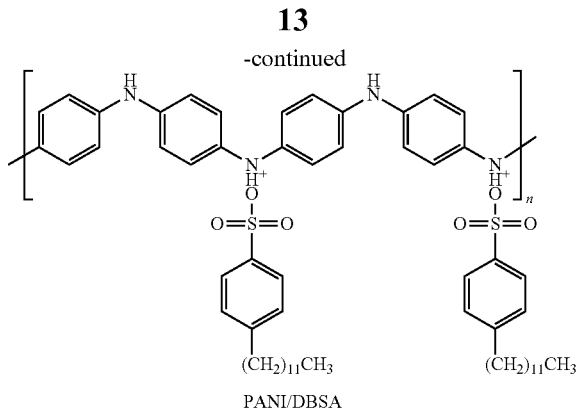

PANI/DBSA

The HIL 14 may be formed by using various methods such as vacuum deposition, spin coating, casting, inkjet printing, or Langmuir Blodgett ("LB") deposition.

When the HIL 14 is formed by vacuum deposition, the deposition conditions may vary with respect to the material used, a structure of a desired HIL, and thermal characteristics. For example, the deposition conditions may include deposition temperature of about 100° C. to about 500° C., a degree of vacuum of about $10^{-8}$ torr to about $10^{-3}$ torr, and deposition rate of about 0.01 Å/sec to about 100 Å/sec.

When the HIL 14 is formed by spin coating, the coating conditions may vary with respect to the material used, a structure of the desired HIL, and its thermal characteristics. For example, the coating conditions may be a coating speed of about 2,000 rpm to about 5,000 rpm and a heat treatment temperature for removing a solvent after coating of about 80° C. to about 300° C.

The thickness of the HIL 14 may be in the range of about 100 Å to about 10,000 Å. In some embodiments, the thickness of the HIL 14 may be in the range of about 100 Å to about 1,000 Å. When the thickness of the HIL 14 is within these ranges, satisfactory hole injection properties may be obtained without substantial increase in driving voltage.

Next, the EML 16 formed of the polymer blend described above is formed on the HIL 14. The polymer blend may include a first polymer having a unit represented by Formula 1 below and a second polymer having a unit represented by Formula 2 below:

Formula 1

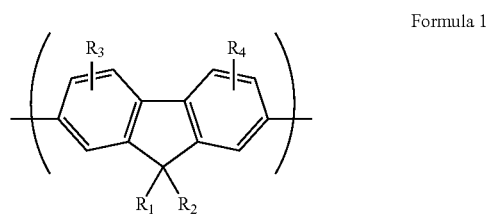

Formula 2

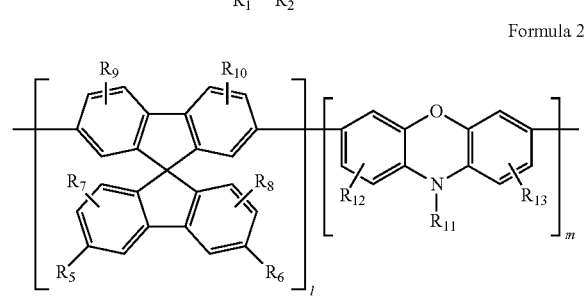

wherein in Formulae 1 and 2, $R_1$ through $R_{13}$, l, and m are the same as defined above.

For example, the polymer blend may include a first polymer having a unit represented by Formula 3 below and a second polymer having a unit represented by Formula 4 below:

Formula 3

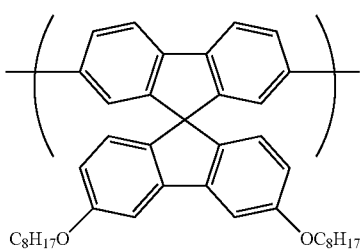

Formula 4

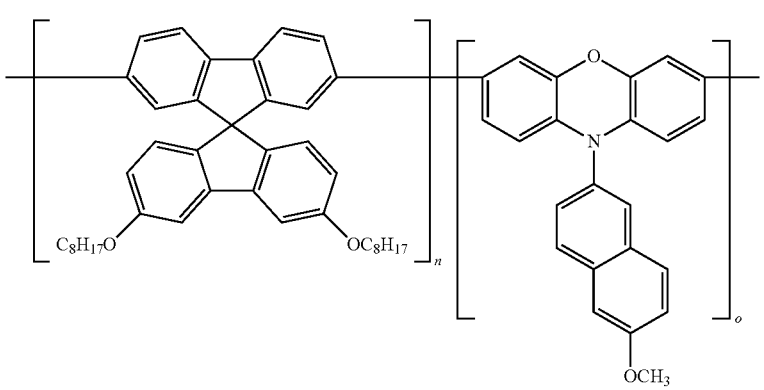

In Formula 4, n is an integer of 1 to 10 and o is an integer of 1 to 3. The first polymer having a unit of Formula 3 may have a molecular weight of about 1,000 Da to about 2,000,000 Da, and the second polymer having a unit of Formula 4 may have a molecular weight of about 1,000 Da to about 2,000,000 Da.

The EML 16 formed of the polymer blend may be formed by spin coating, dip coating, blade coating, inkjet printing, nozzle printing, or a roll-to-roll method such as gravure printing or off-set printing. The thickness of the EML 16 may be in the range of about 100 Å to about 1,000 Å. In some embodiments, the thickness of the EML 16 may be in the range of about 200 Å to about 900 Å. When the thickness of the EML 16 is within these ranges, satisfactory luminescent properties may be obtained without substantial increase in driving voltage.

The second electrode 20 may be formed on the emission layer 16. The material for forming the second electrode 20 may be a material having a relatively low work function. Examples of the material for forming the second electrode 20 include alkali metals such as lithium (Li), sodium (Na), potassium (K), rubidium (Rb), cesium (Cs), and the like; alkali earth metals such as beryllium (Be), magnesium (Mg), calcium (Ca), strontium (Sr), barium (Ba), and the like; metals such as aluminum (Al), scandium (Sc), vanadium (V), zinc (Zn), yttrium (Y), indium (In), cerium (Ce), samarium (Sm), europium (Eu), terbium (Tb), ytterbium (Yb), and the like; alloys of at least two of these metals; alloys of at least one of these metals and at least one selected from gold (Au), silver (Ag), platinum (Pt), copper (Cu), manganese (Mn), titanium (Ti), cobalt (Co), nickel (Ni), tungsten (W), and tin (Sn); graphite; and a graphite intercalation compound. Examples of the alloys include Mg—Ag, Mg—In, Mg—Al, In—Ag, Li—Al, Li—Mg, Li—In, and Ca—Al. In addition, the second electrode 20 may be formed as a single layer or may have a multi-layered structure having at least two layers. The material for forming the second electrode 20 may be used alone or in combination with at least two of the materials described above. The second electrode 20 may be a transparent, a semi-transparent, or a reflective electrode. The thickness of the second electrode 20 may be in the range of about 10 nm to about 10 µm, but is not limited thereto.

Figure 2:
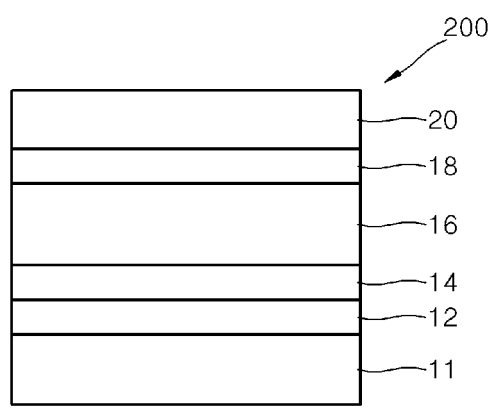
FIG. 2 is a schematic diagram illustrating a structure of an OLED according to another embodiment of the present invention.

FIG. 2 is a schematic diagram illustrating a structure of an OLED 200 according to another exemplary embodiment.

A structure and manufacturing method of the OLED 200 will now be described with reference to FIG. 2. The OLED 200 includes a first electrode 12, an HIL 14, an EML 16, an electron transport layer ("ETL") 18, and a second electrode 20 facing the first electrode 12, all of which are sequentially stacked on the substrate 11. The OLED 200 differs from the OLED 100 of FIG. 1 in that the OLED 200 further includes the ETL 18. The ETL 18 improves the transporting ability of electrons to the EML 16 and enables extra holes to accumulate on the contact surface between the EML 16 and the ETL 18. Thus, even when an EML is formed from the material having excellent hole conducting properties, a decrease in current efficiency may be prevented.

Examples of the material for forming the ETL 18 include, but are not limited to, known electron transporting materials such as quinoline derivatives Alq$_3$ and aluminum(III) bis(2-methyl-8-quinolinate)(4-phenylphenolate) ("BAlq"), 2,9-dimethyl-4,7-diphenyl-1,10-phenanthroline ("BCP"), 4,7-diphenyl-1,10-phenanthroline ("Bphen"), 3-(4-biphenylyl)-4-phenyl-5-tert-butylphenyl-1,2,4-triazole ("TAZ"), 4-(naphthalen-1-yl)-3,5-diphenyl-4H-1,2,4-triazole ("NTAZ"), 2-(4-biphenylyl)-5-(4-tert-butylphenyl)-1,3,4-oxadiazole ("tBu-PBD"), and beryllium bis(benzoquinolin-10-olate) ("Bebq$_2$").

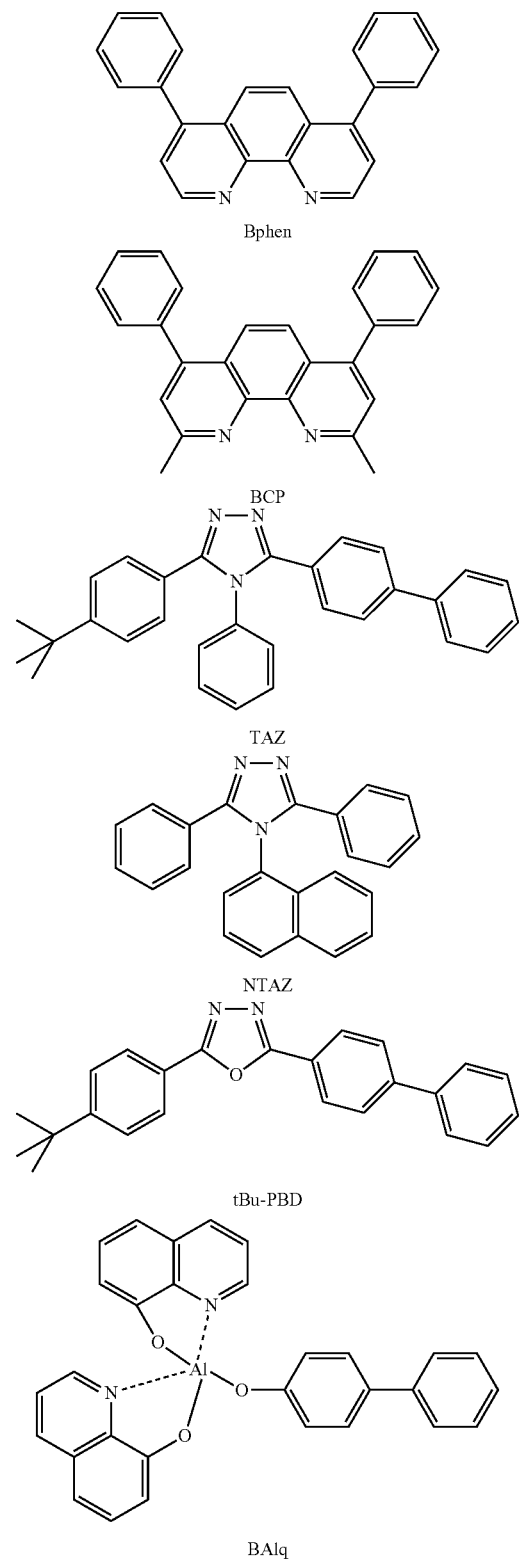

The ETL 18 may be formed by various methods such as casting, inkjet printing, or LB deposition.

When the ETL 18 is formed by vacuum deposition or spin coating, the deposition and coating conditions may vary with respect to the compounds used. However, in general, the deposition and coating conditions may be almost the same as the conditions for forming the HIL 14.

The thickness of the ETL 18 may be in the range of about 100 Å to about 1,000 Å. In some embodiments, the thickness of the ETL 18 may be in the range of about 200 Å to about 500 Å. When the thickness of the ETL 18 is within these ranges, satisfactory electron transport properties may be obtained without substantial increase in driving voltage.

In previous embodiments, the OLED having a first electrode/HIL/EML/second electrode structure or a first electrode/HIL/EML/ETL/second electrode structure was described. However, OLEDs having other structures may also be used. For example, in the structure of the OLED 100 or 200 of FIG. 1 or 2, an HTL (not shown) may be disposed between the HIL 14 and the EML 16, and an electron blocking layer ("EBL") (not shown) may be further disposed between the HIL 14 or the HTL (not shown) and the EML 16. Also, for example, an electron injection layer ("EIL") (not shown) may be further disposed between the ETL 18 and the second electrode 20, and a hole blocking layer ("HBL") (not shown) may be further disposed between the EML 16 and the ETL 18 or the EIL (not shown).

A material for forming the HTL (not shown) may be a known hole transporting material. Examples of the known hole transporting material include carbazole derivatives such as N-phenylcarbazole and polyvinylcarbazole; and amine derivatives having an aromatic condensed ring such as N,N'-bis(3-methylphenyl)-N,N'-diphenyl-[1,1-biphenyl]-4,4'-diamine ("TPD"), 4,4'-bis[N-(1-naphthyl)-N-phenylamino]biphenyl ("NPB"), and 4,4',4"-tris(N-carbazolyl)triphenylamine ("TCTA").

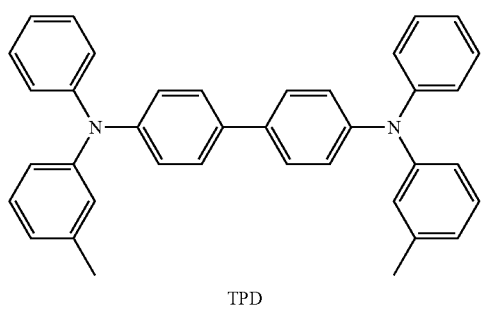

TPD

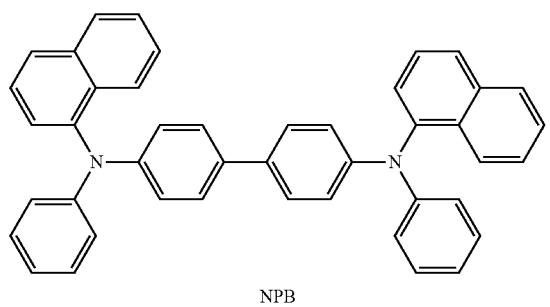

NPB

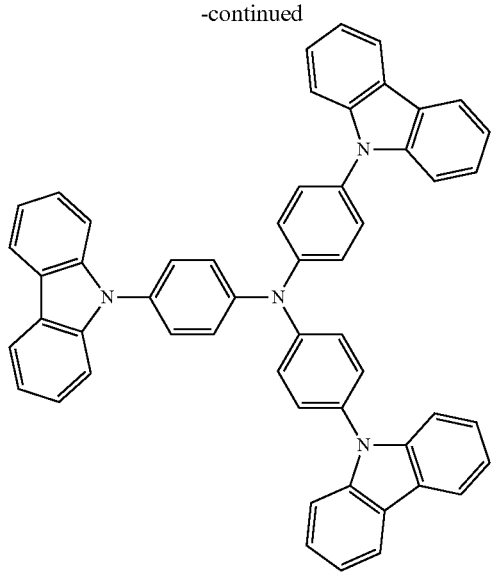

TCTA

The HTL (not shown) may be formed by using various methods such as vacuum deposition, spin coating, casting, or LB deposition. When the HTL is formed by vacuum deposition or spin coating, the deposition and coating conditions may vary with respect to the compounds used. However, in general, the deposition and coating conditions may be almost the same as the conditions for forming the HIL 14.

The thickness of the HTL (not shown) may be in the range of about 50 Å to about 1,000 Å. In some embodiments, the thickness of the HTL may be in the range of about 100 Å to about 800 Å. When the thickness of the HTL is within these ranges, satisfactory hole transport properties may be obtained without substantial increase in driving voltage. Alternatively, a functional layer having hole injection and hole transport abilities may be formed instead of the HIL 14 and the HTL.

A material for forming the EIL (not shown) may include a well-known material for forming an EIL, such as LiF, NaCl, NaF, CsF, $Li_2O$, BaO, or $BaF_2$. The EIL (not shown) may be formed using various known methods such as deposition, sputtering, etc.

The thickness of the EIL (not shown) may be in the range of about 1 Å to about 100 Å. In some embodiments, the thickness of the EIL may be in the range of about 3 Å to about 90 Å. When the thickness of the EIL is within these ranges, satisfactory electron injection properties may be obtained without substantial increase in driving voltage. Alternatively, a functional layer having electron injection and electron transport abilities may be formed instead of the EIL and the ETL.

The HBL (not shown) may prevent excitons or holes of the EML 16 from being diffused into the second electrode 20. The HBL (not shown) may be formed by using various methods such as vacuum deposition, spin coating, casting, or LB deposition. When the HBL is formed by vacuum deposition or spin coating, the deposition and coating conditions may vary with respect to the compounds used. However, in general, the deposition and coating conditions may almost be the same as the conditions for forming the HIL 14. Examples of a material for forming the HBL include, but are not limited to, known hole blocking materials such as oxadiazole derivatives, triazole derivatives, and phenanthroline derivatives.

The thickness of the HBL (not shown) may be in the range of about 50 Å to about 1,000 Å. In some embodiments, the thickness of the HBL may be in the range of about 100 Å to about 300 Å. When the thickness of the HBL (not shown) is within these ranges, satisfactory hole blocking properties may be obtained.

Hereinafter, a method for controlling charge mobility of an EML of an OLED, according to an exemplary embodiment, will be described in detail.

The EML for an OLED may be formed from the polymer blend as described above. That is, the EML may be formed from the polymer blend of the first polymer represented by Formula 1 that has excellent electron transporting ability and the second polymer represented by Formula 2 that has excellent hole transporting ability. The electron transporting ability of the EML may be improved by increasing the amount of the first polymer in the polymer blend. On the other hand, the hole transporting ability of the EML may be improved by increasing the amount of the second polymer in the polymer blend. Thus, the charge mobility of the EML may be controlled by adjusting the amounts of the first and second polymers constituting the polymer blend, and an advantageous charge balance in the EML may be obtained accordingly.

One or more embodiments will now be described in more detail with reference to the following examples. These examples are for illustrative purposes only and are not intended to limit the scope of the invention.

EXPERIMENTAL EXAMPLE 1

A hole-only device and an electron-only device, each device including an EML formed from a polymer having a unit represented by Formula 3 below (i.e., poly[9,9-bis(4-octyloxyphenyl)-2,7-fluorene]), were manufactured. The charge transport properties of the polymer having a unit of Formula 3 were measured by using the hole-only device and the electron-only device.

Formula 3

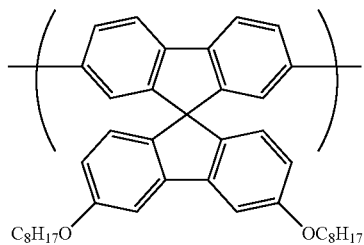

Figure 3:
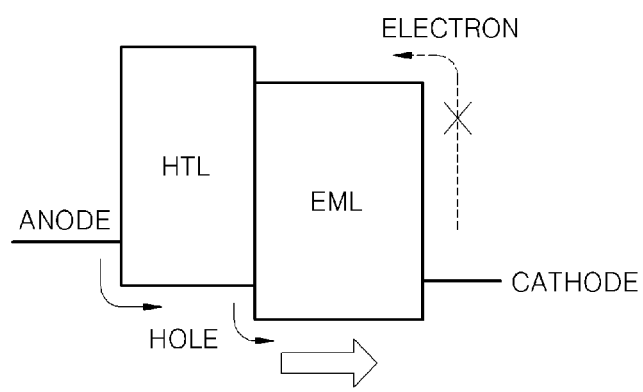
FIG. 3 is a schematic diagram illustrating a structure of a hole-only device used in Experimental Example.

FIG. 3 is a schematic diagram illustrating a structure of a hole-only device used in Experimental Example 1. Referring to FIG. 3, the hole-only device includes an anode, an HTL, an EML, and a cathode. In this regard, a work function of the anode is similar to a HOMO energy level of the HTL in that it facilitates hole injection from the anode to the HTL, the injected holes migrating into the EML. On the other hand, a work function of the cathode greatly differs from a LUMO energy level of the EML in that it is difficult to inject electrons from the cathode to the EML. Thus, a current flows in the hole-only device by the flow of holes.

Figure 4:
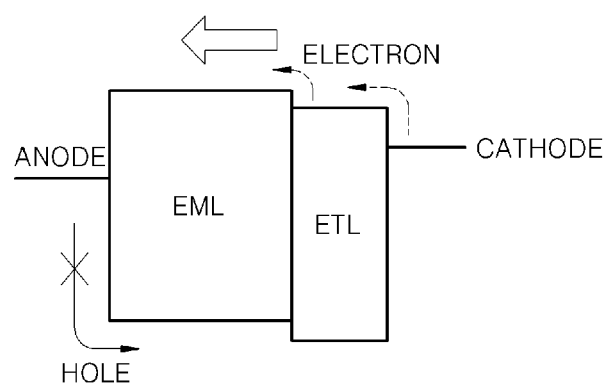
FIG. 4 is a schematic diagram illustrating a structure of an electron-only device used in Experimental Example.

FIG. 4 is a schematic diagram illustrating a structure of an electron-only device used in Experimental Example 1. Referring to FIG. 4, the electron-only device includes an anode, an EML, an ETL, and a cathode. In this regard, a difference between a work function of the anode and a HOMO energy level of the EML is so large that it is difficult to inject holes from the anode to the EML. On the other hand, a work function of the cathode is similar to a LUMO energy level of the ETL in that it facilitates electron injection from the cathode to the ETL, and the injected electrons migrate into the EML. Thus, a current flows in the electron-only device by the flow of electrons.

(a) Manufacture of Hole-Only Device

A glass substrate on which a patterned ITO electrode had been formed was washed and then treated with ultraviolet light and ozone for 10 minutes. Subsequently, PEDOT:PSS (AI4083) was coated on the ITO glass substrate, and the resulting glass substrate was heat treated at 200° C. for 5 minutes and then further heat treated in a glove box at 200° C. for 5 minutes to form a PEDOT:PSS layer having a thickness of 50 nm. Then, a 0.5 wt % solution prepared by dissolving the polymer having a unit of Formula 3 (molecular weight: 400,000 Da) in toluene was spin coated on the PEDOT:PSS layer, and the resultant structure was heat treated at 150° C. for 30 minutes to form a polymer layer having a thickness of 70 nm.

Au was deposited on the polymer layer to a thickness of 20 nm. Al was deposited on the Au-deposited polymer layer to a thickness of 100 nm. As a result, a hole-only device having an ITO (150 nm)/PEDOT:PSS layer (50 nm)/polymer layer (70 nm)/Au layer (20 nm)/Al layer (100 nm) structure was obtained.

(b) Manufacture of Electron-Only Device

An Al electrode was deposited on a glass substrate to a thickness of 50 nm. A 0.5 wt % solution prepared by dissolving the polymer having a unit of Formula 3 in toluene was spin coated on the Al electrode, and the resulting structure was heat treated at 150° C. for 30 minutes to form a polymer layer having a thickness of 70 nm. A TPBi layer was formed on the polymer layer to a thickness of 30 nm. NaF and Al were sequentially deposited on the TPBi layer to thicknesses of 5 nm and 100 nm, respectively. As a result, an electron-only device having an Al electrode (50 nm)/polymer layer (70 nm)/TPBi layer (30 nm)/NaF (5 nm)/Al (100 nm) structure was obtained.

(c) Measurement of Hole Current and Electron Current

Figure 5:
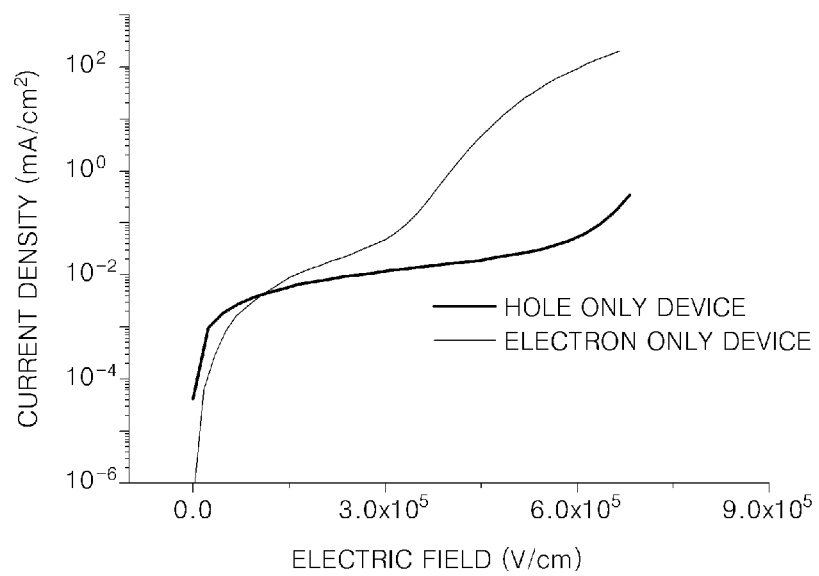
FIG. 5 is a graph showing measurement results of current density-voltage characteristics of a hole-only device and an electron-only device manufactured according to Experimental Example 1.

FIG. 5 is a graph showing measurement results of current density-voltage characteristics of a hole-only device and an electron-only device manufactured according to Experimental Example 1. The measured current density of the hole-only device of Experimental Example 1 is a current density generated by the holes, and the measured current density of the electron-only device of Experimental Example 1 is a current density generated by the electrons. As illustrated in FIG. 5, an electron current density was higher than a hole current density. From this result, it is confirmed that poly [9,9-bis(4-octyloxyphenyl)-2,7-fluorene] used as the polymer having a unit of Formula 3 is an electron transporting polymer having high electron mobility.

EXPERIMENTAL EXAMPLE 2

A hole-only device and an electron-only device, each of which included an EML formed by using a polymer having a unit represented by Formula 5 below, were manufactured, and charge transport properties of the polymer having a unit of Formula 5 were measured by using the hole-only device and the electron-only device. The polymer having a unit of Formula 5 has a molecular weight of 100,000.

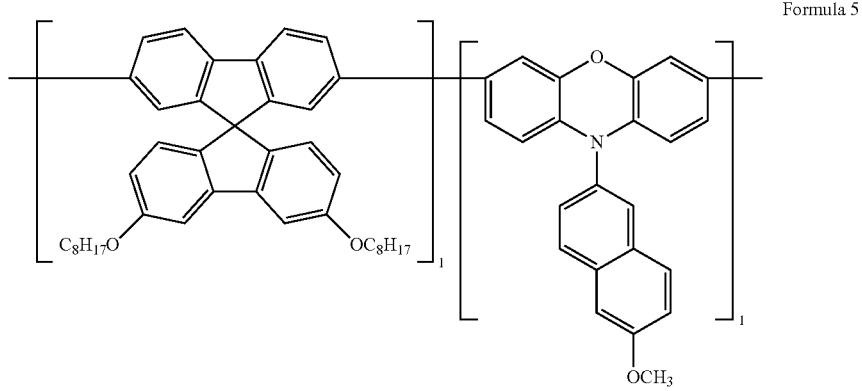

Formula 5

(a) Manufacture of Hole-Only Device

A hole-only device was manufactured in the same manner as in (a) of Experimental Example 1, except that the polymer having a unit of Formula 5 was used instead of the polymer having a unit of Formula 3.

(b) Manufacture of Electron-Only Device

An electron-only device was manufactured in the same manner as in (b) of Experimental Example 1, except that the polymer having a unit of Formula 5 was used instead of the polymer having a unit of Formula 3.

(c) Measurement of Hole Current and Electron Current

Figure 6:
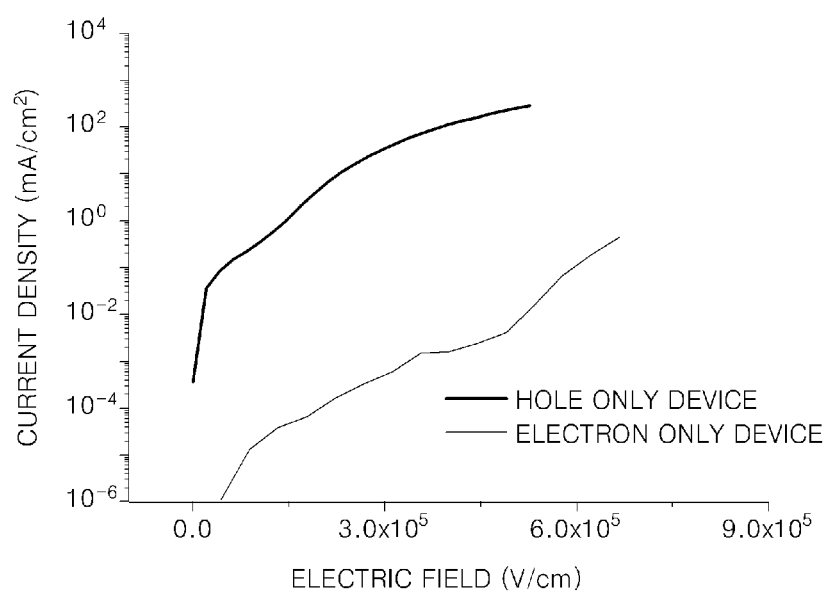
FIG. 6 is a graph showing measurement results of current density-voltage characteristics of a hole-only device and an electron-only device manufactured according to Experimental Example 2.

FIG. 6 is a graph showing measurement results of current density-voltage characteristics of a hole-only device and an electron-only device manufactured according to Experimental Example 2. As illustrated in FIG. 6, the hole current density was higher than the electron current density. This result confirms that the polymer having a unit of Formula 5 is a hole transporting polymer having high hole mobility.

EXPERIMENTAL EXAMPLE 3

A hole-only device and an electron-only device, each of which included an EML formed by using a polymer having a unit represented by Formula 6 below, were manufactured, and charge transport properties of the polymer having a unit of Formula 6 were measured by using the hole-only device and the electron-only device. The polymer having a unit of Formula 6 has a molecular weight of 700,000.

(b) Manufacture of Electron-Only Device

An electron-only device was manufactured in the same manner as in (b) of Experimental Example 1, except that the polymer having a unit of Formula 6 was used instead of the polymer having a unit of Formula 3.

(c) Measurement of Hole Current and Electron Current

Figure 7:
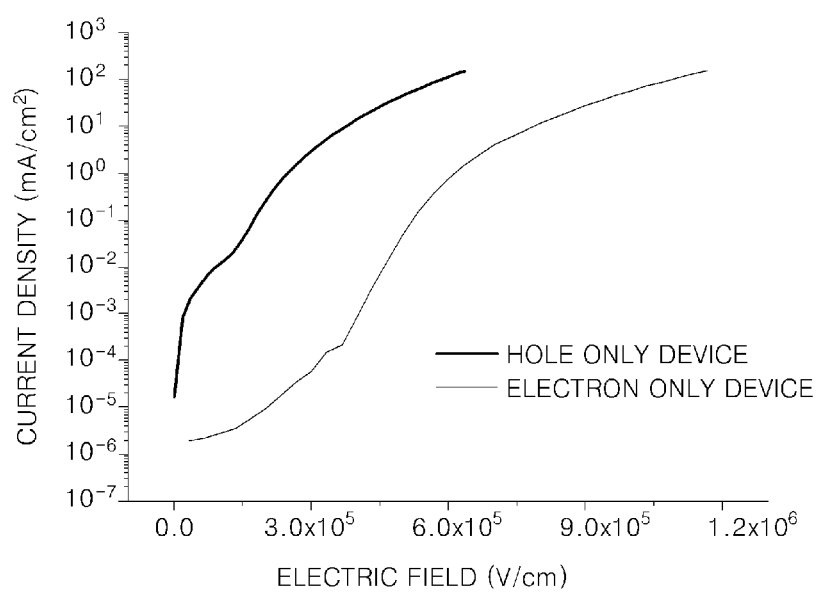
FIG. 7 is a graph showing measurement results of current density-voltage characteristics of a hole-only device and an electron-only device manufactured according to Experimental Example 3.

FIG. 7 is a graph showing measurement results of current density-voltage characteristics of a hole-only device and an electron-only device manufactured according to Experimental Example 3. As illustrated in FIG. 7, a hole current density was higher than an electron current density. From this result, it is confirmed that the polymer having a unit of Formula 6 is a hole transporting polymer having high hole mobility, like the polymer having a unit of Formula 5.

Referring to FIGS. 6 and 7, the polymer having a unit of Formula 5 has a higher hole current density than that of the polymer having a unit of Formula 6. This is because phenoxazine derivative units contribute more to the transport of holes, and thus, the polymer having a unit of Formula 5 having a larger ratio of the phenoxazine derivative units than the polymer having a unit of Formula 6 exhibits a higher hole current density. Without being bound by theory, the high hole transporting ability of the phenoxazine deriva-

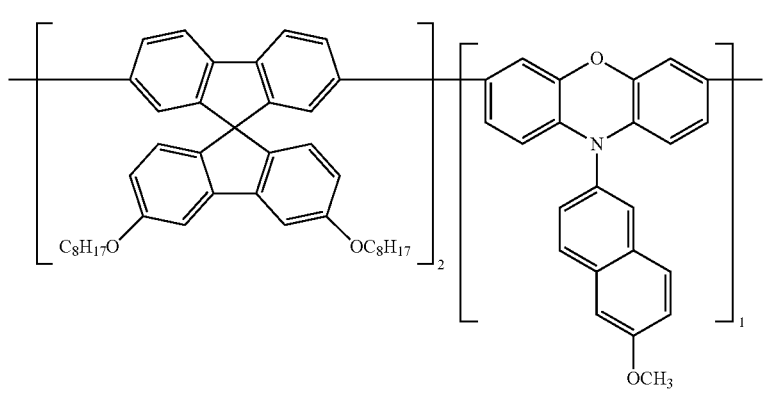

Formula 6

(a) Manufacture of Hole-Only Device

A hole-only device was manufactured in the same manner as in (a) of Experimental Example 1, except that the polymer having a unit of Formula 6 was used instead of the polymer having a unit of Formula 3.

tive units is attributed to the ability of a nitrogen atom of phenoxazine to act as an electron donor with respect to the fluorene linked to the phenoxazine group through phenyl or pi-conjugation, thus making the phenoxazine derivative units capable of transporting the holes.

EXPERIMENTAL EXAMPLE 4

A hole-only device and an electron-only device, each of which included an EML formed from a polymer having a unit of Formula 7 below, were manufactured. The charge transport properties of the polymer having a unit of Formula 7 were measured by using the hole-only device and the electron-only device. The polymer having a unit of Formula 7 has a molecular weight of 700,000 Da.

Formula 7

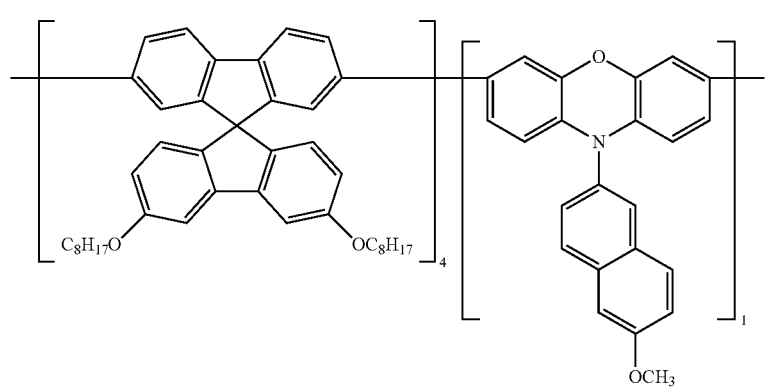

(a) Manufacture of Hole-Only Device

A hole-only device was manufactured in the same manner as in (a) of Experimental Example 1, except that the polymer having a unit of Formula 7 was used instead of the polymer having a unit of Formula 3.

(b) Manufacture of Electron-Only Device

An electron-only device was manufactured in the same manner as in (b) of Experimental Example 1, except that the polymer having a unit of Formula 7 was used instead of the polymer having a unit of Formula 3.

(c) Measurement of Hole Current and Electron Current

Figure 8:
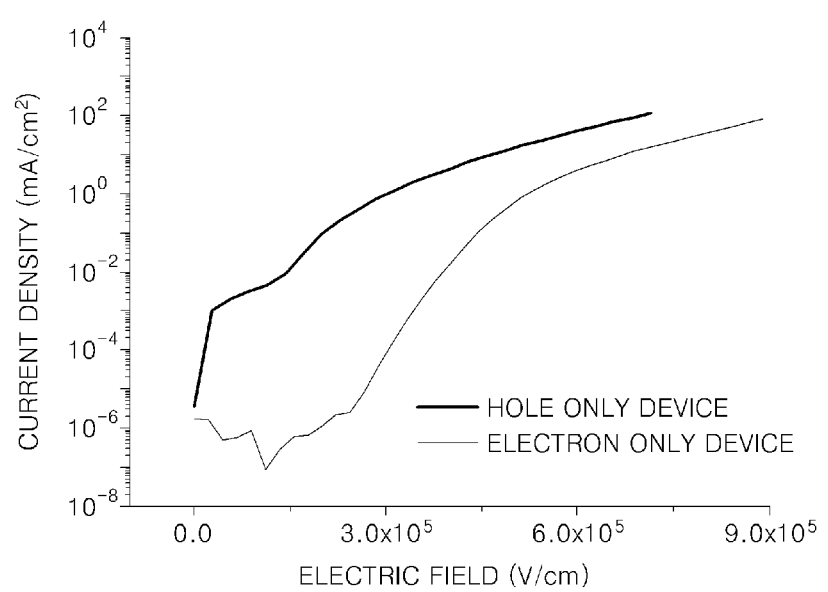
FIG. 8 is a graph showing measurement results of current density-voltage characteristics of a hole-only device and an electron-only device manufactured according to Experimental Example 4.

FIG. 8 is a graph showing measurement results of current density-voltage characteristics of the hole-only device and electron-only device manufactured according to Experimental Example 4. As illustrated in FIG. 8, a hole current density was higher than an electron current density. From this result, it is confirmed that the polymer having a unit of Formula 7 is a hole transporting polymer having high hole mobility, like the polymer having a unit of Formula 5.

Referring to FIGS. 6, 7, and 8, the polymer having a unit of Formula 7 has a lower hole current density and a higher electron current density than the polymer having a unit of Formula 5 and the polymer having a unit of Formula 6. This result coincides with the tendency of the polymer having a unit of Formula 5 and the polymer having a unit of Formula 6 to have the increased hole current density with the increase in the mole fraction of the phenoxazine derivative units, and to have the increased electron current density with the increase in the mole fraction of the fluorene derivative units.

EXAMPLE 1

An OLED having a structure as illustrated in FIG. 1 was manufactured.

A glass substrate on which a patterned ITO electrode had been formed was washed and then treated with ultraviolet light and ozone for 10 minutes. Subsequently, PEDOT:PSS (AI4083) was coated on the ITO glass substrate, and the resulting glass substrate was heat treated at 200° C. for 5 minutes and then further heat treated in a glove box in a nitrogen ($N_2$) atmosphere at 200° C. for 5 minutes to form a PEDOT:PSS layer having a thickness of 50 nm.

A 0.5 wt % solution prepared by dissolving a mixture of the polymer having a unit of Formula 3 and the polymer having a unit of Formula 5 at a weight ratio of 80:20 in toluene was spin coated on the PEDOT:PSS layer and the resulting structure was heat treated at 150° C. for 30 minutes to form an EML having a thickness of 70 nm. As seen from the measurement results of Experimental Examples 1 and 2, the polymer having a unit of Formula 3 is an electron transporting polymer, and the polymer having a unit of Formula 5 is a hole transporting polymer. Next, NaF and Al were sequentially deposited on the EML in a vacuum chamber to the thicknesses of 5 nm and 100 nm, respectively. Then, the resultant light-emitting diode was glass-encapsulated by using an ultraviolet curable resin.

EXAMPLE 2

An OLED was manufactured in the same manner as in Example 1, except that a mixture of the polymer having a unit of Formula 3 and the polymer having a unit of Formula 5 at a weight ratio of 70:30 was used as a material for forming the EML instead of the mixture of the polymer having a unit of Formula 3 and the polymer having a unit of Formula 5 at a weight ratio of 80:20. As seen from the measurement results of Experimental Example 3, the polymer having a unit of Formula 5 is a hole transporting polymer.

EXAMPLE 3

An OLED was manufactured in the same manner as in Example 1, except that a mixture of the polymer having a unit of Formula 3 and the polymer having a unit of Formula 5 at a weight ratio of 60:40 was used as a material for forming the EML instead of the mixture of the polymer having a unit of Formula 3 and the polymer having a unit of Formula 5 at a weight ratio of 80:20.

EXAMPLE 4

An OLED was manufactured in the same manner as in Example 1, except that the polymer having a unit of Formula 6 was used as a material for forming the EML instead of the polymer having a unit of Formula 5. As seen from the measurement results of Experimental Example 3, the polymer having the unit of Formula 6 is a hole transporting polymer.

EXAMPLE 5

An OLED was manufactured in the same manner as in Example 4, except that a mixture of the polymer having a unit of Formula 3 and the polymer having a unit of Formula 6 at a weight ratio of 70:30 was used as a material for forming the EML instead of the mixture of the polymer having a unit of Formula 3 and the polymer having a unit of Formula 6 at a weight ratio of 80:20.

EXAMPLE 6

An OLED was manufactured in the same manner as in Example 4, except that a mixture of the polymer having a unit of Formula 3 and the polymer having a unit of Formula 6 at a weight ratio of 60:40 was used as a material for forming the EML instead of the mixture of the polymer having a unit of Formula 3 and the polymer having a unit of Formula 6 at a weight ratio of 80:20.

EXAMPLE 7

An OLED was manufactured in the same manner as in Example 2, except that the polymer having a unit of Formula 7 was used as a material for forming the EML instead of the polymer having a unit of Formula 5. As seen from the measurement results of Experimental Example 4, the polymer having a unit of Formula 7 is a hole transporting polymer.

EXAMPLE 8

An OLED was manufactured in the same manner as in Example 7, except that a mixture of the polymer having a unit of Formula 3 and the polymer having a unit of Formula 7 at a weight ratio of 60:40 was used as a material for forming the EML instead of the mixture of the polymer having a unit of Formula 3 and the polymer having a unit of Formula 7 at a weight of 70:30.

COMPARATIVE EXAMPLE 1

An OLED was manufactured in the same manner as in Example 1, except that a polymer having a unit represented by Formula 8 below was used as a material for forming the EML instead of the mixture of the polymer having a unit of Formula 3 and the polymer having a unit of Formula 5. The polymer having a unit of Formula 8 is a hole transporting polymer, like the polymers having units of Formulae 5 through 7. The polymer having a unit of Formula 8 has a molecular weight of 110,000 Da.

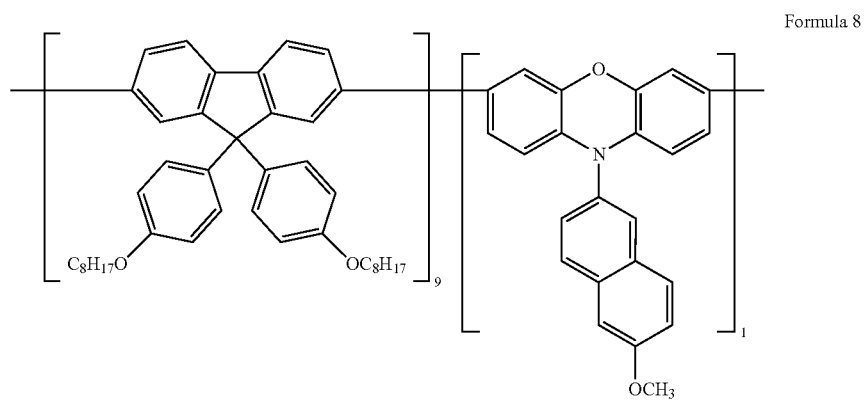

Formula 8

COMPARATIVE EXAMPLE 2

An OLED was manufactured in the same manner as in Example 1, except that a polymer having a unit represented by Formula 9 below was used as a material for forming the EML instead of the mixture of the polymer having a unit of Formula 3 and the polymer having a unit of Formula 5. The polymer having a unit of Formula 9 is a hole transporting polymer, like the polymers having units of Formulae 5 through 8. The polymer having a unit of Formula 9 has a molecular weight of 300,000 Da.

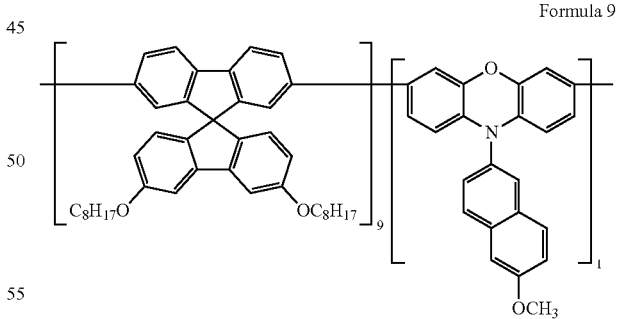

Formula 9

Electroluminescence Spectrum

Figure 9:
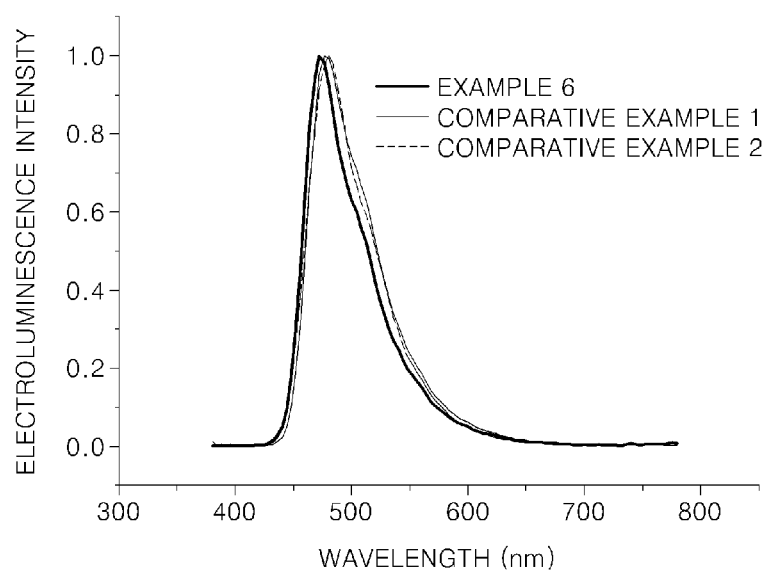
FIG. 9 is a graph showing electroluminescence spectrum results of OLEDs manufactured according to Example 6 and Comparative Examples 1 and 2.

FIG. 9 is a graph showing electroluminescence spectrum results of OLEDs manufactured according to Example 6 and Comparative Examples 1 and 2. A ratio of fluorene to phenoxazine in the hole transporting polymer included in the EML of the OLED of Example 6 is 2:1, and a ratio of fluorene to phenoxazine in the hole transporting polymer included in the EML of each of the OLEDs of Comparative Examples 1 and 2 is 9:1. The OLED of Comparative Example 1 includes an EML including a polymer having butterfly-type fluorene derivative units, and the OLED of Comparative Example 2 includes an EML including a polymer having spiro-type fluorene derivative units. Referring to FIG. 9, electroluminescence spectra of the OLEDs of Comparative Examples 1 and 2 are almost identical to each other and the OLEDs of Comparative Examples 1 and 2 exhibit blue light emission. This result confirms that even though a ratio of fluorene derivative units to phenoxazine derivative units varies, there is little change in an emission spectrum. This result also confirms that the emission spectrum of the OLED of Example 6 including the polymer blend is almost identical to that of the OLEDs of Comparative Examples 1 and 2 each including a copolymer. Thus, this indicates that a luminophore that determines an emission spectrum is fluorene conjugatively linked to the phenoxazine derivative.

Brightness and Current Efficiency

Figure 10:
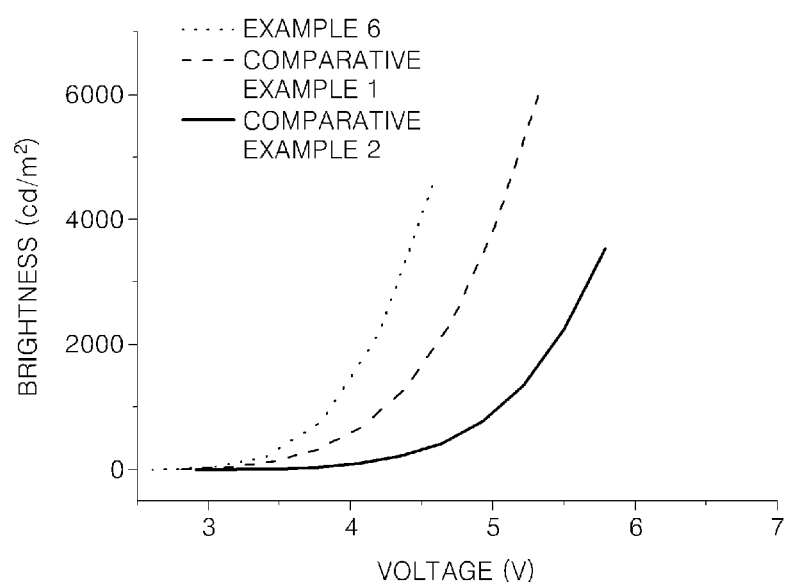
FIG. 10 is a graph showing luminance-voltage characteristics of OLEDs of Example 6 and Comparative Examples 1 and 2.
Figure 11:
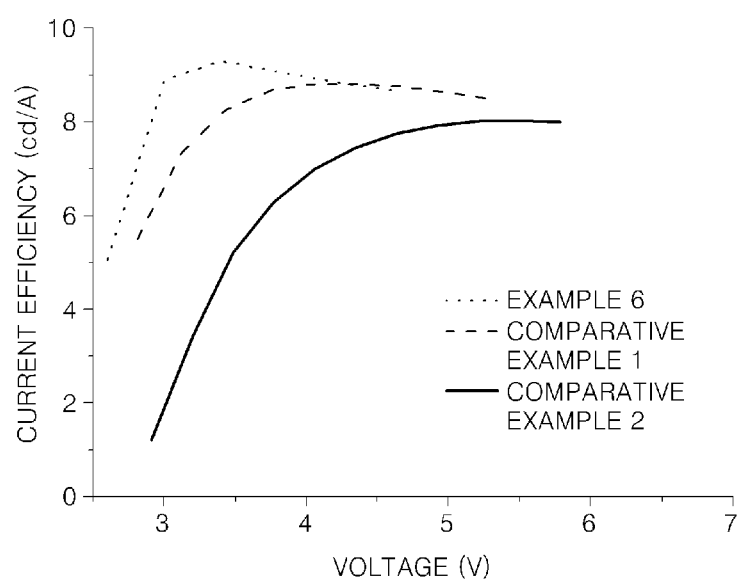
FIG. 11 is a graph showing current efficiency-voltage characteristics of OLEDs of Example 6 and Comparative Examples 1 and 2.

FIG. 10 is a graph showing luminance-voltage characteristics of OLEDs of Example 6 and Comparative Examples 1 and 2. FIG. 11 is a graph showing current efficiency-voltage characteristics of OLEDs of Example 6 and Comparative Examples 1 and 2. Referring to FIGS. 10 and 11, brightness and current efficiency of the OLED of Example 6 are higher than those of the OLEDs of Comparative Examples 1 and 2. From this result, it is expected that the polymer blend included in the EML of the OLED of Example 6 also has high photoluminescence efficiency, i.e., an efficiency of converting excitons into photons.

Lifetime

Figure 12:
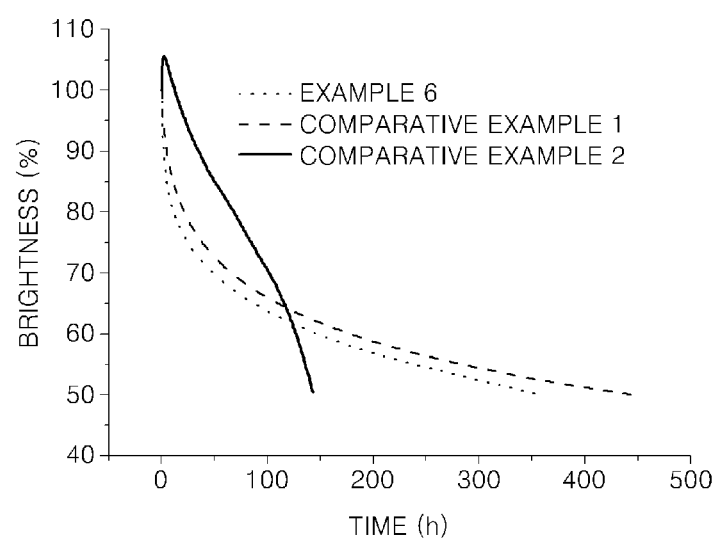
FIG. 12 is a graph showing luminance according to time, i.e., a lifetime of each of the OLEDs of Example 6 and Comparative Examples 1 and 2.

FIG. 12 is a graph showing brightness according to time, i.e., a lifetime of each of the OLEDs of Example 6 and Comparative Examples 1 and 2. As shown in FIG. 12, the OLED of Comparative Example 1 had the longest lifetime among the three OLEDs, and the OLED of Comparative Example 2 had the shortest lifetime among the three OLEDs. The lifetime of the OLED of Example 6 was similar to that of the OLED of Comparative Example 1. These results confirm that while the OLED of Comparative Example 2 including the EML formed by using only the copolymer of a spiro-type fluorene derivative unit and a phenoxazine derivative unit has a short lifetime, the lifetime of the OLED of Example 6 including the EML formed by using the blend of a copolymer of a spiro-type fluorene derivative unit and a phenoxazine derivative unit and polyfluorene polymer does not decrease.

A current efficiency, driving voltage, and half lifetime of each of the OLEDs of Examples 1 through 8 and Comparative Examples 1 and 2 are shown in Table 1 below.

Referring to Table 1, as the amount of the hole transporting polymer increases, the driving voltages of the OLEDs of Examples 1 to 8 and Comparative Examples 1 and 2 decrease. The OLEDs of Examples 1 through 8 have a structure as illustrated in FIG. 1. This structure does not include an ETL and is appropriate for a structure having an EML with high electron mobility. Thus, the decrease in driving voltage as the result of the increase in the amount of the hole transporting polymer is attributed to the structure of the OLED. In the structure depicted in FIG. 1, due to high electron mobility EML, the light emitting region is rich in electrons, the amount of light emitting is determined by the amount of holes injected into a light-emitting region. Thus, as a hole transporting ability of the EML increases, driving voltage may be reduced.

In the OLEDs of Examples including the EML using the same hole transporting polymer and the same electron transporting polymer, as the amount of the hole transporting polymer increases, current efficiency somewhat decreases. This decrease is expected because as the amount of the hole transporting polymer increases, hole conducting properties are improved so that a probability of forming excitons decreases as the light-emitting region proceeds from a positive electrode towards a negative electrode.

Considering that the efficiency of an OLED varies according to layer structures, the OLED having the structure illustrated in FIG. 2 was manufactured. The OLED having the structure of FIG. 2 includes an ETL, and thus, this structure is appropriate for a structure including an EML having high hole mobility.

EXAMPLE 9

A glass substrate on which a patterned ITO electrode had been formed was washed and then treated with ultraviolet light and ozone for 10 minutes. Subsequently, PEDOT:PSS (AI4083) was coated on the ITO glass substrate, and the resulting glass substrate was heat treated at 200° C. for 5 minutes and then further heat treated in a glove box in a nitrogen (N$_2$) atmosphere at 200° C. for 5 minutes to form a PEDOT:PSS layer having a thickness of 50 nm. A 0.5 wt % solution prepared by dissolving a mixture of the polymer having a unit of Formula 3 and the polymer having a unit of Formula 5 at a weight ratio of 90:10 in toluene was spin coated on the PEDOT:PSS layer, and the resulting structure was heat treated at 150° C. for 30 minutes to form an EML having a thickness of 70 nm. Next, TPBi and LG201:Liq

TABLE 1

| | Electron transporting polymer | | Hole transporting polymer | | Efficiency | Driving voltage | Half lifetime |
|---|---|---|---|---|---|---|---|
| | Material | Content | Material | Content | (cd/A) | (V)[2] | (hr)[1] |
| Example 1 | Formula 3 | 80% | SF:Po(1:1) | 20% | 7.2 | 6.4 | 50 |
| Example 2 | Formula 3 | 70% | SF:Po(1:1) | 30% | 6.95 | 5.9 | 140 |
| Example 3 | Formula 3 | 60% | SF:Po(1:1) | 40% | 6.5 | 5.6 | 250 |
| Example 4 | Formula 3 | 80% | SF:Po(2:1) | 20% | 9.3 | 4.8 | 190 |
| Example 5 | Formula 3 | 70% | SF:Po(2:1) | 30% | 8.9 | 4.6 | 260 |
| Example 6 | Formula 3 | 60% | SF:Po(2:1) | 40% | 8.5 | 4.5 | 360 |
| Example 7 | Formula 3 | 70% | SF:Po(4:1) | 30% | 6.2 | 3.9 | 133 |
| Example 8 | Formula 3 | 60% | SF:Po(4:1) | 40% | 5.9 | 3.9 | 162 |
| Comparative Example 1 | | | BF:Po(9:1) | 100% | 8.8 | 4.8 | 450 |
| Comparative Example 2 | | | SF:Po(9:1) | 100% | 8.0 | 5.6 | 81 |

[1]Reference initial brightness of lifetime measurement: 1,000 cd/m$^2$
[2]Driving voltage needed for reference brightness (1,000 cd/m$^2$)

(1:1) were sequentially vacuum deposited on the EML to thicknesses of 10 nm and 20 nm, respectively, and LiF and Al were sequentially deposited thereon to thicknesses of 1 nm and 100 nm, respectively. Then, the resultant light-emitting diode was glass-encapsulated by using an ultraviolet curable resin. The TPBi can play a role of hole blocking layer as well as electron transporting layer. So, a recombination zone would be well-confined at the interface between EML and TPBi, resulting in the high current efficiency for the EML having a much higher hole transporting ability.

EXAMPLE 10

An OLED was manufactured in the same manner as in Example 9, except that a mixture of the polymer having a unit of Formula 3 and the polymer having a unit of Formula 5 at a weight ratio of 70:30 was used instead of the mixture of the polymer having a unit of Formula 3 and the polymer having a unit of Formula 5 at a weight ratio of 90:10.

EXAMPLE 11

An OLED was manufactured in the same manner as in Example 9, except that a mixture of the polymer having a unit of Formula 3 and the polymer having a unit of Formula 5 at a weight ratio of 50:50 was used instead of the mixture of the polymer having a unit of Formula 3 and the polymer having a unit of Formula 5 at a weight ratio of 90:10.

EXAMPLE 12

An OLED was manufactured in the same manner as in Example 9, except that a mixture of the polymer having a unit of Formula 3 and the polymer having a unit of Formula 5 at a weight ratio of 30:70 was used instead of the mixture of the polymer having a unit of Formula 3 and the polymer having a unit of Formula 5 at a weight ratio of 90:10.

Current efficiencies of the OLEDs of Examples 9 to 12 are shown in Table 2 below.

TABLE 2

| | Electron transporting polymer | | Hole transporting polymer | | Efficiency (cd/A) |
| --- | --- | --- | --- | --- | --- |
| | Material | Amount | Material | Amount | |
| Example 9 | Formula 3 | 90% | SF:Po(2:1) | 10% | 6.4 |
| Example 10 | Formula 3 | 70% | SF:Po(2:1) | 30% | 7.6 |
| Example 11 | Formula 3 | 50% | SF:Po(2:1) | 50% | 8.2 |
| Example 12 | Formula 3 | 30% | SF:Po(2:1) | 70% | 7.6 |

When the amount of the hole transporting polymer in the polymer blend included in the EML increases, a hole transporting ability of the EML is improved, and thus, a light-emitting region moves close to a cathode so that energy quenching by a metal occurs, resulting in decreased current efficiency. In this regard, Examples 9 to 12 were performed to measure a substantial current efficiency of each polymer blend included in the EML by reducing the decrease in current efficiency due to the migration of the light-emitting region, i.e., a layer structure.

Referring to Table 2, even though the amount of the hole transporting polymer in the polymer blend included in the EML varies from 10% to 70%, the efficiency of each OLED does not decrease and is maintained at a similar level. That is, it is confirmed that the OLEDs of Examples 9 to 12 including the EML formed by using the polymer blend including a small amount of the hole transporting polymer or including the EML formed by using the polymer blend including a large amount of the hole transporting polymer have high blue current efficiency.

Therefore, when a blue EML formed by using the polymer blend listed above is stacked together with an EML of another color, the hole and electron mobility may be sufficiently controlled depending on the structure of the OLED without a reduction in efficiency thereof.

As described above, according to the one or more of the above embodiments of the present invention, a blue EML is formed by using a blend of a hole transporting polymer and an electron transporting polymer. By adjusting a composition ratio of the hole transporting polymer to the electron transporting polymer, the mobility of holes and electrons passing through the EML may be controlled, whereby an efficiency and a lifetime of an OLED may be improved.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A polymer blend comprising a first polymer comprising a unit represented by Formula 1 and a second polymer comprising a unit represented by Formula 2:

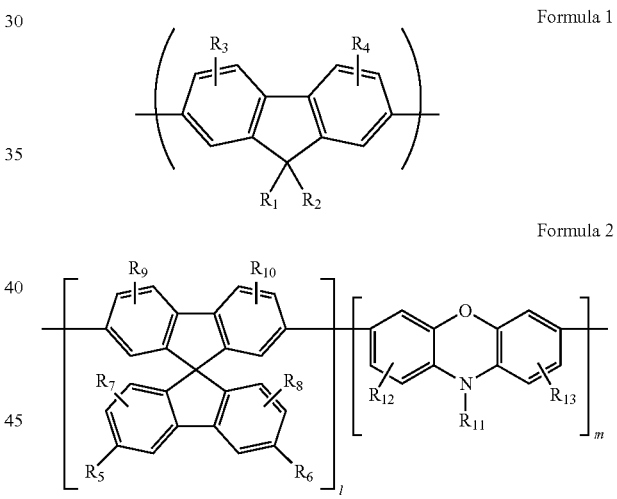

wherein $R_1$ through $R_4$, $R_9$, $R_{10}$, $R_{12}$, and $R_{13}$ are each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid group or a salt thereof, a substituted or unsubstituted $C_1$-$C_{30}$ alkyl group, a substituted or unsubstituted $C_1$-$C_{30}$ alkenyl group, a substituted or unsubstituted $C_1$-$C_{30}$ alkynyl group, a substituted or unsubstituted $C_3$-$C_{30}$ cycloalkyl group, a substituted or unsubstituted $C_3$-$C_{30}$ cycloalkenyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —N($Q_1$)($Q_2$), or —Si($Q_3$)($Q_4$)($Q_5$);

$R_5$ and $R_6$ are n-octyloxy groups;
$R_7$ and $R_8$ are hyrdrogen;
$R_{11}$ is a 4-methoxynaphthyl group;
$Q_1$ through $Q_5$ are each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_3$-$C_{30}$ cycloalkyl group, a $C_6$-$C_{30}$ aryl group, or a $C_2$-$C_{30}$ heteroaryl group; and
in Formula 2, l is an integer of 1 to 10 and m is an integer of 1 to 3, wherein l and m represent the molar ratio of each subunit in Formula 2,
wherein a mole ratio of l to m of Formula 2 is in a range of about 1:1 to about 5:1.

2. The polymer blend of claim 1, wherein the first polymer and the second polymer have blue light emission properties.

3. The polymer blend of claim 1, wherein the first polymer is an electron transporting polymer, and the second polymer is a hole transporting polymer.

4. The polymer blend of claim 1, wherein a molecular weight average of the first polymer is in a range of about 1,000 Da to about 2,000,000 Da.

5. The polymer blend of claim 1, wherein a molecular weight average of the second polymer is in a range of about 1,000 Da to about 2,000,000 Da.

6. The polymer blend of claim 1, wherein the first polymer comprises a copolymer of at least two of the units represented by Formula 1, wherein the at least two units are different from each other.

7. The polymer blend of claim 1, wherein the second polymer comprises a blend of at least two different polymers each having the unit represented by Formula 2.

8. The polymer blend of claim 1, wherein an amount of the first polymer is in a range of about 10 wt % to about 90 wt %, and an amount of the second polymer is in a range of about 10 wt % to about 90 wt %.

9. The polymer blend of claim 1, wherein $R_1$ and $R_2$ are each independently a $C_1$-$C_{10}$ alkyl group, a $C_6$-$C_{12}$ aryl group covalently linked to an alkyl group, or a $C_6$-$C_{12}$ aryl group covalently linked to an alkoxy group, and $R_3$ and $R_4$ are each independently hydrogen, deuterium, a halogen atom, a hydroxyl group, a cyano group, a nitro group, an amino group, a carboxyl group or a salt thereof, an ester group, a $C_1$-$C_{10}$ alkyl group, a $C_6$-$C_{12}$ aryl group covalently linked to an alkyl group, or a $C_6$-$C_{12}$ aryl group covalently linked to an alkoxy group.

10. The polymer blend of claim 1, wherein $R_9$ and $R_{10}$ are each independently hydrogen, deuterium, a halogen atom, a hydroxyl group, a cyano group, a nitro group, an amino group, an amidino group, a carboxyl group or a salt thereof, an ester group, a $C_1$-$C_{10}$ alkyl group, a $C_6$-$C_{12}$ aryl group covalently linked to an alkyl group, or a $C_6$-$C_{12}$ aryl group covalently linked to an alkoxy group.

11. The polymer blend of claim 1, wherein $R_{12}$ and $R_{13}$ are each independently hydrogen, deuterium, a halogen atom, a hydroxyl group, a cyano group, a nitro group, an amino group, a carboxyl group or a salt thereof, an ester group, a $C_1$-$C_{10}$ alkyl group, a $C_6$-$C_{12}$ aryl group covalently linked to an alkyl group, or a $C_6$-$C_{12}$ aryl group covalently linked to an alkoxy group.

12. The polymer blend of claim 1, wherein $R_1$ and $R_2$ are each independently a $C_1$-$C_{10}$ alkyl group, a $C_6$-$C_{12}$ aryl group covalently linked to an alkyl group, or a $C_6$-$C_{12}$ aryl group covalently linked to an alkoxy group; and $R_3$, $R_4$, $R_9$, $R_{10}$, $R_{12}$, and $R_{13}$ are each independently hydrogen, deuterium, a halogen atom, a hydroxyl group, a cyano group, a nitro group, an amino group, a carboxyl group or a salt thereof, an ester group, a $C_1$-$C_{10}$ alkyl group, a $C_6$-$C_{12}$ aryl group covalently linked to an alkyl group, or a $C_6$-$C_{12}$ aryl group covalently linked to an alkoxy group.

13. The polymer blend of claim 1, wherein the first polymer is a polymer is a polymer having a unit represented by Formula 3, and the second polymer is a polymer having a unit represented by Formula 4:

Formula 3

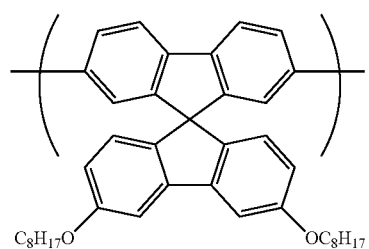

Formula 4

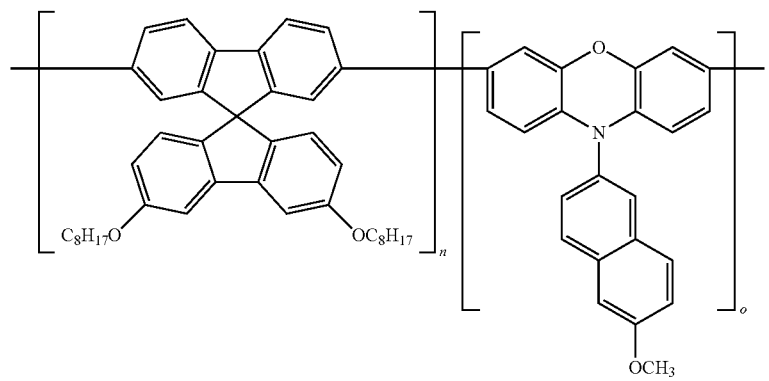

wherein in Formula 4, n is a molar fraction of spirofluorene derivative units, an integer of 1 to 4 and o is a molar fraction of N-aryl phenoxazine derivative units, an integer of 1 to 3.

14. The polymer blend of claim 1, wherein the second polymer is a polymer having a unit represented by Formula 4:

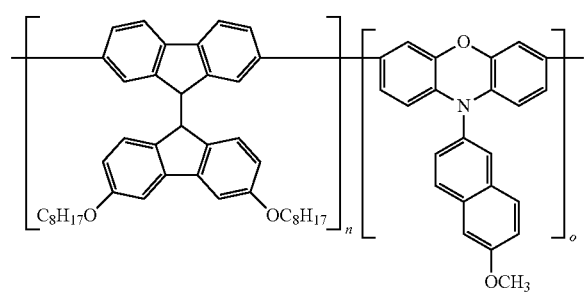

Formula 4 wherein in Formula 4, n is a molar fraction of spirofluorene derivative units, an integer of 1 to 4 and o is molar fraction of N-aryl phenoxazine derivative units, an integer of 1 to 3.

15. An organic light-emitting diode comprising:
a first electrode;
a second electrode; and
an organic layer disposed between the first electrode and the second electrode,
wherein the organic layer comprises an emission layer comprising the polymer blend according to claim 1.

16. The organic light-emitting diode of claim 15, wherein the organic layer further comprises a hole injection layer, a hole transport layer, an electron injection layer, an electron transport layer, a hole blocking layer, or an electron blocking layer.

17. The organic light-emitting diode of claim 15, wherein the emission layer emits blue light.

18. A method of controlling charge mobility of an emission layer of an organic light-emitting diode, the method comprising adjusting a composition ratio of the first polymer to the second polymer of the organic light-emitting diode of claim 15.

19. The method of claim 18, wherein electron mobility is increased by increasing the amount of the first polymer.

20. The method of claim 18, wherein hole mobility is increased by increasing the amount of the second polymer.

* * * * *